(12) United States Patent
Lee et al.

(10) Patent No.: US 11,293,987 B2
(45) Date of Patent: Apr. 5, 2022

(54) BATTERY CAPACITY PREDICTION SYSTEM USING CHARGE AND DISCHARGE CYCLES OF A BATTERY TO PREDICT CAPACITY VARIATIONS, AND ASSOCIATED METHOD

(71) Applicants: SAMSUNG SDI CO., LTD., Yongin-si (KR); POSTECH Research and Business Development Foundation, Pohang-si (KR)

(72) Inventors: Gyeonghwan Lee, Yongin-si (KR); Minho Kim, Pohang-si (KR); Soohee Han, Pohang-si (KR)

(73) Assignees: SAMSUNG SDI CO., LTD., Yongin-si (KR); POSTECH Research and Business Development Foundation, Pohang-si (KR)

( * ) Notice: Subject to any disclaimer, the term of this patent is extended or adjusted under 35 U.S.C. 154(b) by 0 days.

(21) Appl. No.: 16/822,469

(22) Filed: Mar. 18, 2020

(65) Prior Publication Data

US 2020/0386819 A1    Dec. 10, 2020

(30) Foreign Application Priority Data

Jun. 5, 2019    (KR) ........................ 10-2019-0066881

(51) Int. Cl.
     *G01R 31/36*      (2020.01)
     *G01R 31/367*     (2019.01)
     *G01R 31/382*     (2019.01)

(52) U.S. Cl.
     CPC ....... *G01R 31/3648* (2013.01); *G01R 31/367* (2019.01); *G01R 31/382* (2019.01)

(58) Field of Classification Search
     CPC .................................................. G01R 31/3648
(Continued)

(56) References Cited

U.S. PATENT DOCUMENTS

| 10,228,425 B2 | 3/2019 | Park et al. |
| 2015/0120225 A1* | 4/2015 | Kim ...................... G01R 31/392 |
| | | 702/63 |

(Continued)

FOREIGN PATENT DOCUMENTS

| CN | 104505894 B | 1/2017 |
| CN | 107238800 A | 10/2017 |

(Continued)

OTHER PUBLICATIONS

Gal, Yarin, and Zoubin Ghahramani. "Dropout as a Bayesian approximation: Representing model uncertainty in deep learning." international conference on machine learning. 2016.

(Continued)

*Primary Examiner* — Ricky Go
(74) *Attorney, Agent, or Firm* — Lee IP Law, P.C.

(57) ABSTRACT

A system and method of predicting variations in a capacity of a battery, the system including an ADFM management device including an experimental data collector to collect at least one first piece of data about the capacity of the battery, an ADF optimizer to optimize a first calculation equation, and a virtual data generator to generate at least one second piece of data; and a server including a training unit to train an artificial intelligence model for outputting the relative capacity variation value by using the at least one first piece of data and the at least one second piece of data as training data, and a prediction unit to obtain a relative capacity variation prediction value, which is output from the artificial intelligence model when the number of charge and discharge cycles and the charge and discharge conditions of the battery are input to the artificial intelligence model.

4 Claims, 6 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2015/0369874 A1 | 12/2015 | Park et al. | |
| 2017/0205469 A1 | 7/2017 | Song et al. | |
| 2017/0212170 A1* | 7/2017 | Torai | H01M 10/4285 |
| 2019/0113577 A1* | 4/2019 | Severson | G01R 31/392 |
| 2019/0257886 A1* | 8/2019 | Hooshmand | G01R 31/392 |
| 2020/0011932 A1* | 1/2020 | Hooshmand | G01R 31/367 |
| 2020/0164763 A1* | 5/2020 | Holme | B60L 58/10 |

FOREIGN PATENT DOCUMENTS

| | | |
|---|---|---|
| CN | 109061504 A | 12/2018 |
| KR | 10-2016-0000317 A | 1/2016 |
| KR | 10-2017-0085365 A | 7/2017 |
| KR | 10-1912615 B1 | 10/2018 |
| WO | WO2019-017991 A1 | 1/2019 |

OTHER PUBLICATIONS

A critical review on self-adaptive Li-ion battery ageing models, Journal of Power Sources, vol. 401, Oct. 15, 2018, pp. 85-101, M. Lucu et al.
Lithium-Ion Battery Remaining Useful Life Prediction With Box Cox Transformation and Monte Carlo Simulation, IEEE Transactions on Industrial Electronics (vol. 66, Issue: 2, Feb. 2019),1585-1597.
A novel capacity estimation method for lithium-ion batteries using fusion estimation of charging curve sections and discrete Arrhenius aging model, Applied Energy, vol. 251, Oct. 1, 2019, 113327.
A review of lithium-ion battery state of charge estimation and management system in electric vehicle applications: Challenges and recommendations, Renewable and Sustainable Energy Reviews, vol. 78, Oct. 2017, pp. 834-854.
End-of-discharge and End-of-life Prediction in Lithium-ion Batteries with Electrochemistry-based Aging Models, AIAA Infotech @ Aerospace, Matthew Daigle et al.
Remaining useful life estimation of Lithium-ion batteries based on thermal dynamics,2017 American Control Conference (ACC).
Degradation of Lithium Ion Batteries under Complex Conditions of Use, Zeitschrift fur Physikalische Chemie | vol. 227: Issue 1.
Realistic lifetime prediction approach for Li-ion batteries, Applied Energy, vol. 162, Jan. 15, 2016, pp. 839-852.
Calendar ageing analysis of a LiFePO4/graphite cell with dynamic model validations: Towards, realistic lifetime predictions, Journal of Power Sources, vol. 272, 45-57, 2014.
Prognostics Methods for Battery Health Monitoring Using a Bayesian Framework, IEEE Transactions on Instrumentation and Measurement (vol. 58, Issue: 2, Feb. 2009).
Novel data-efficient mechanism-agnostic capacity fade model for Li-ion batteries, IEEE Transactions on Industrial Electronics , May 27, 2020.
European Search Report dated Oct. 15, 2020.

* cited by examiner

BATTERY CAPACITY PREDICTION SYSTEM USING CHARGE AND DISCHARGE CYCLES OF A BATTERY TO PREDICT CAPACITY VARIATIONS, AND ASSOCIATED METHOD

CROSS-REFERENCE TO RELATED APPLICATION

Korean Patent Application No. 10-2019-0066881, filed on Jun. 5, 2019, in the Korean Intellectual Property Office, and entitled: "Method and System for Predicting Capacity Variations According to Charge and Discharge Cycles of Battery," is incorporated by reference herein in its entirety.

BACKGROUND

1. Field

Embodiments relate to a method and system for predicting capacity variations according to charge and discharge cycles of battery.

2. Description of the Related Art

Secondary batteries are a type of battery that is capable of being recharged after being charged, and common secondary batteries include lithium-ion batteries having high energy density, high power density, and a wide operational voltage range. Recently, with the increasing use of electric vehicles, computer-implemented battery management system (BMS) technology, which is a core technology of electric vehicles, is being developed. In addition, with the accelerated development of new renewable energy sources, energy storage systems (ESSs) for stably supplying new renewable energy to power systems have been considered. Therefore, battery-related technology such as BMS technology is more important than ever.

Batteries have to be replaced with new batteries at appropriate times, e.g., at times when the SOH of batteries decreases by a certain amount, for the economical use of batteries and the prevention of loss of life.

SUMMARY

The embodiments may be realized by providing a battery capacity prediction system including an aging density function model (ADFM) management device; and a server, wherein the ADFM management device includes an experimental data collector configured to collect at least one first piece of data about the capacity of the battery according to a number of charge and discharge cycles and charge and discharge cycle conditions of the battery, an ADF optimizer configured to optimize a first calculation equation for predicting a relative capacity variation value of the battery based on the at least one first piece of data, and a virtual data generator configured to generate at least one second piece of data about the relative capacity variation value corresponding to the number of charge and discharge cycles and the charge and discharge conditions of the battery, based on the first calculation equation; wherein the server includes a training unit configured to train an artificial intelligence model for outputting the relative capacity variation value by using the at least one first piece of data and the at least one second piece of data as training data, and a prediction unit configured to obtain a relative capacity variation prediction value, which is output from the artificial intelligence model when the number of charge and discharge cycles and the charge and discharge conditions of the battery are input to the artificial intelligence model.

The embodiments may be realized by providing a computer-implemented method of predicting variations in a capacity of a battery according to charge and discharge cycles of the battery, the method comprising collecting at least one first piece of data about the capacity of the battery according to a number of charge and discharge cycles and charge and discharge cycle conditions of the battery; optimizing a first calculation equation for predicting a relative capacity variation value of the battery based on the at least one first piece of data; generating at least one second piece of data about the relative capacity variation value corresponding to the number of charge and discharge cycles and the charge and discharge conditions of the battery, based on the first calculation equation; training an artificial intelligence model for outputting the relative capacity variation value by using the at least one first piece of data and the at least one second piece of data as training data; and obtaining a relative capacity variation prediction value, which is output from the artificial intelligence model when the number of charge and discharge cycles and the charge and discharge conditions of the battery are input to the artificial intelligence model.

The charge and discharge conditions of the battery may include a constant current charge period, a constant voltage charge period, a first rest period, a constant current discharge period, and a second rest period, and collecting the at least one first piece of data may include collecting information about the capacity of the battery according to the charge and discharge conditions.

Collecting the at least one first piece of data may include performing a reference performance test (RPT) on the battery every preset number of charge and discharge cycles; and obtaining an open circuit voltage-state of charge lookup table (OCV-SOC LUT) based on results of the RPT, the first calculation equation is for calculating the relative capacity variation value by calculating combinations with repetition based on a charge rate, a discharge rate, a maximum state of charge (SOC) per cycle, a minimum SOC per cycle, and a temperature of the battery, and the optimizing of the first calculation equation may include determining the maximum SOC per cycle and the minimum SOC per cycle of the battery based on the OCV-SOC LUT.

Optimizing the first calculation equation may include obtaining a parameter of the first calculation equation, the parameter minimizing an error between a first relative capacity loss amount obtained based on the first calculation equation and a second relative capacity loss amount obtained based on the at least one first piece of data; and updating the first calculation equation based on the parameter.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
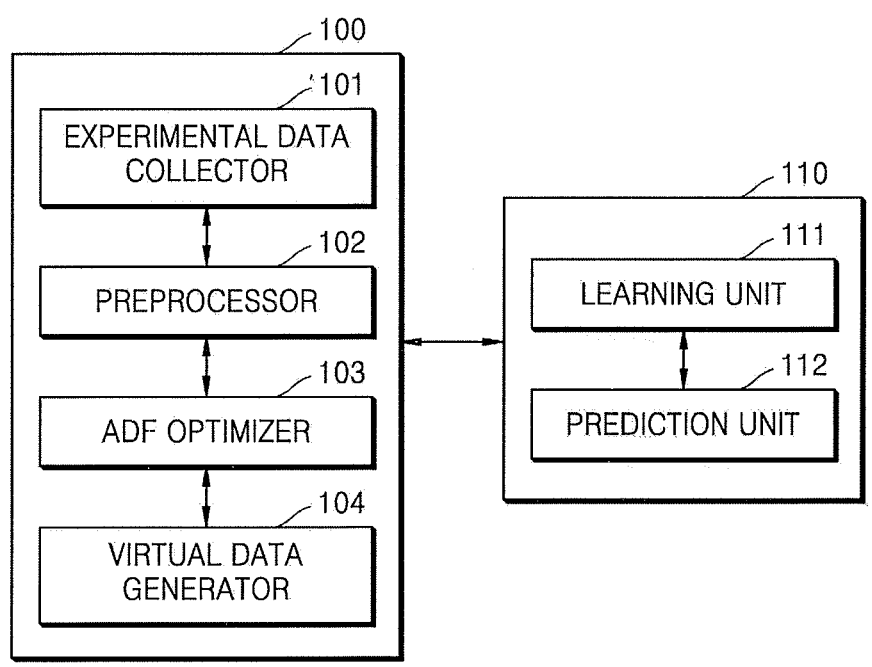
FIG. 1 illustrates a schematic view of a prediction system for predicting variations in the capacity of a battery according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Like reference numerals refer to like elements throughout.

As used herein, the term "or" and "and/or" are not exclusive terms, and include any and all combinations of one or more of the associated listed items. Throughout the disclosure, the expression "at least one of a, b or c" indicates only a, only b, only c, both a and b, both a and c, both b and c, all of a, b, and c, or variations thereof.

In various embodiments, expressions such as "comprise," "include," or "may include" are used to specify the presence of functions, operations, or elements, but do not preclude the presence of one or more other functions, operations, or elements. In addition, it will be understood that terms such as "comprise," "include," or "have" when used herein, specify the presence of features, integers, steps, operations, elements, components, or combinations thereof, but do not preclude the presence or addition of one or more other features, integers, steps, operations, elements, components, or combinations thereof.

In various embodiments, terms such as "1st," "2nd," "first," or "second" may modify various elements but do not limit the elements. For example, the terms do not limit the order and/or importance of the elements. The terms may be used to distinguish one element from another element. For example, a first user device and a second user device may all be user devices and may represent different user devices. For example, within the scope of the present disclosure, a first element may be referred to as a second element, and similarly a second element may be referred to as a first element.

It should be understood that when an element is referred to as being "coupled" or "connected" to another element, the element may be coupled or connected directly to the other element or any other element may be between the two elements. In contrast, it may be understood that when an element is referred to as being "directly coupled" or "directly connected" to another element, there is no element between the two elements.

In embodiments, terms such as a "module," a "unit," or a "part" may be used to denote a unit having at least one function or performing at least one operation and may be implemented with hardware, software, or a combination of hardware and software. In addition, a plurality of "modules," "units," "parts," or the like may be integrated into at least one module or chip and may be provided as at least one processor, except for the case in which each needs to be provided as separate specific hardware.

The terms used in the present disclosure are merely for describing specific embodiments, and are not intended to limit various embodiments of the present disclosure. The terms of a singular form may include plural forms unless otherwise mentioned.

Unless defined otherwise, all terms used herein, including technical or scientific terms, have the same meanings as commonly understood by those of ordinary skill in the art to which various embodiments of the present disclosure pertain.

Terms such as those defined in a generally used dictionary may be interpreted to have the same meanings as the contextual meanings in the relevant field of art, and are not to be interpreted to have ideal or excessively formal meanings unless clearly defined herein.

When repeatedly charged and discharged, secondary batteries may undergo an aging process, an increase in internal resistance, and a decrease in capacity. The degree of aging of batteries may be denoted with an indicator called "state of health (SOH)", and the SOH of batteries may be calculated using the present internal resistance or capacity of the batteries. The internal resistance of batteries may vary with the types of inputs to the batteries, and as the aging of batteries progresses, variations in the internal resistance of the batteries may become more irregular than variations in the capacity of the batteries. It is common to define SOH using capacity variations. When there is a significant decrease in the SOH of batteries (e.g., when the degree of aging of batteries is high), issues may occur in the operation of devices using the energy of the batteries. Examples of such issues may include phenomena, e.g., internal short circuits or thermal runaway, and inconvenience in the operation of devices due to a short period of time from a fully charged state to the next charge.

Hereinafter, various embodiments will be described with reference to the accompanying drawings.

FIG. 1 illustrates a schematic view of a prediction system for predicting variations in the capacity of a battery according to an embodiment.

Referring to FIG. 1, the prediction system 10 for predicting variations in the capacity of a battery may include an aging density function model (ADFM) management device 100 and a server 110.

In an implementation, a computer-implemented process for predicting variations in the capacity of the battery may be divided into two processes. The first process may be a process of collecting, by the ADFM management device 100, experimental data according to the charge and discharge cycles of the battery and optimizing parameters of an ADFM.

The second process may be a process of generating virtual data using the optimized ADFM by the server 110 and training a Bayesian neural network (BNN) using the experimental data and the virtual data as training data to utilize the BNN for capacity variation prediction.

For example, the ADFM management device 100 may include an experimental data collector 101, a preprocessor 102, an ADF optimizer 103, and a virtual data generator 104.

The experimental data collector 101 may be for collecting at least one piece of experiment data or at least one first piece of data about the capacity of the battery according to the number of charge and discharge cycles and conditions for the charge and discharge cycles. The experimental data collector 101 may acquire, as experimental data, results obtained by repeatedly performing a cycle experiment based on a predefined cycle. For example, experimental data on the battery may be obtained by repeating a charge and discharge cycle experiment.

In an implementation, the experimental data collector 101 may obtain data by performing a reference performance test (RPT) every preset number of charge and discharge cycles. For example, the RPT may refer to an experiment in which charging is continuously performed with a constant current (CC) of 0.01 C-rate or less from a $V_{min}$ at which the state of charge (SOC) of the battery is defined as 0% to a $V_{max}$ at which the SOC of the battery is defined as 100%. The RPT may be performed in order to measure the varying capacity of the battery.

The preprocessor 102 may be for preprocessing the collected experimental data. The preprocessing may include converting obtained experimental data into a form for optimizing the ADFM according to the embodiment.

In addition, the preprocessor 102 may acquire a capacity value (mAh) by integrating current value data with respect to time during the RPT. In addition, an open circuit voltage-state of charge lookup table (OCV-SOC LUT) may be obtained based on data obtained through a continuous discharge experiment performed at a CC of 0.01 C-rate or less.

The ADF optimizer 103 may be for optimizing parameters included in an aging density function (ADF) according to the embodiment. For example, the ADF may be a model designed such that when the number of charge and discharge cycles and charge and discharge cycle conditions are input to the ADF, the ADF may output a relative capacity variation value of the battery at the number of charge and discharge cycles.

Factors of the ADF may include current C-rate, SOC, and temperature (T), and the value of the ADF may be an aging density. The aging density may refer to the amount of variation in relative capacity per unit time.

The virtual data generator 104 may be for generating virtual data using the optimized ADFM. The virtual data may be data about an aging density corresponding to an arbitrary number of charge and discharge cycles and arbitrary charge and discharge cycle conditions.

The server 110 of the embodiment may include a training unit 111 and a prediction unit 112. The server 110 may be a server for storing an artificial intelligence (AI) model, training the AI model, and predicting variations in the capacity of the battery using the AI model.

In an implementation, the server 110 may be implemented as a single server, or the server 110 may be implemented as a plurality of servers. For example, the server 110 may be implemented as a plurality of servers such as a database server for storing experimental data and virtual data, a server for storing and training an AI model such as a BNN, and a statistical server for collecting statistics from data values predicted using AI and storing the statistics.

In an implementation, the training unit 111 may be for training the AI model using experimental data and virtual data as training data. In an implementation, the AI model may be a deep learning model using, e.g., a convolutional neural network (CNN) model, a recurrent neural network (RNN) model, a long short term memory (LSTM) model, or the like. In an implementation, the AI model may be another model.

The prediction unit 112 may obtain a predicted value for a battery capacity variation by using the trained AI model according to the embodiment. According to the embodiment, when an arbitrary number of charge and discharge cycles and arbitrary charge and discharge cycle conditions are input to the trained AI model, the prediction unit 112 may output a relative capacity variation value corresponding to the arbitrary number of charge and discharge cycles and the arbitrary charge and discharge cycle conditions.

In an implementation, as illustrated in FIG. 1, the ADFM management device 100 and the server 110 may be implemented as separate configurations. In an implementation, the ADFM management device 100 and the server 110 may be implemented in one configuration. For example, the ADFM management device 100 may perform all processes that the server 110 performs.

In an implementation, the experimental data collector 101, the preprocessor 102, the ADF optimizer 103, and the virtual data generator 104 may be implemented as separate software modules driven by a processor. Each of the software modules may perform one or more functions and operations described in the present specification. In an implementation, each configuration may be implemented as a separate module, or all the configurations may be implemented as one module.

Figure 2:
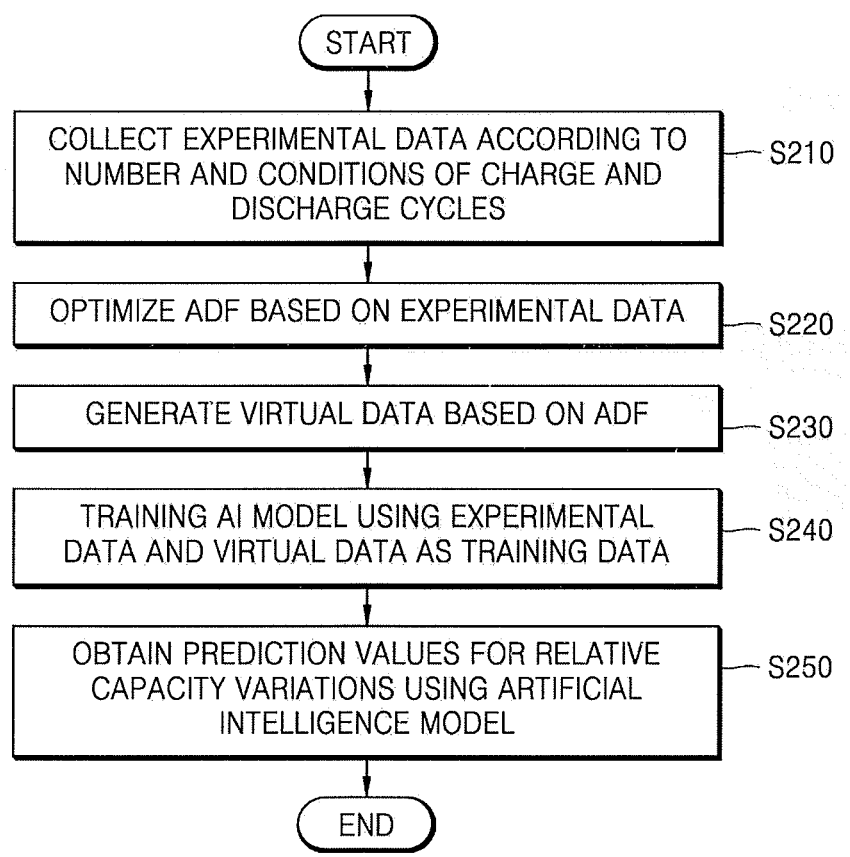
FIG. 2 illustrates a flowchart of a method of predicting variations in the capacity of a battery according to charge and discharge cycles of the battery by using the prediction system according to an embodiment.

FIG. 2 illustrates a flowchart of a prediction method of predicting variations in the capacity of a battery according to charge and discharge cycles of the battery by using the prediction system 10 according to an embodiment.

Referring to FIG. 2, in the embodiment, the prediction system 10 may collect experimental data (or first data) about the capacity of a battery according to the number of charge and discharge cycles and charge and discharge cycle conditions (S210).

Results obtained by repeatedly performing a cycle experiment based on a predefined cycle may be obtained as the experimental data. For example, experimental data on the battery may be obtained by repeating a charge and discharge cycle experiment.

In an implementation, the predefined cycle may include a CC charge period, a constant voltage (CV) charge period, a first rest period, a CC discharge period, and a second reset period. A process that proceeds in this order is defined as one charge and discharge cycle.

The CC charge period may be a period for charging with a CC; the CV charge period may be a period for charging at a CV after reaching an upper cut-off voltage; the first rest period may be a period during which no current is applied after reaching a cut-off current; the CC discharge period may be a period for discharging with a CC; and the second rest period may be a period during which no current is applied after reaching a lower cut-off voltage.

In an implementation, the prediction system 10 may acquire data by performing an RPT every preset number of charge and discharge cycles. As noted above, the RPT may refer to an experiment in which charging is continuously performed with a CC of 0.01 C-rate or less from a $V_{min}$ at which the SOC of the battery is defined as 0% to a $V_{max}$ at which the SOC of the battery is defined as 100%. The RPT may be performed in order to measure the varying capacity of the battery.

In an implementation, the prediction system 10 may acquire a capacity value (mAh) by integrating a current value measured during the RPT with respect to time. In addition, an OCV-SOC LUT may be obtained based on data obtained through a continuous discharge experiment performed at a CC of 0.01 C-rate or less.

In an implementation, the prediction system 10 may optimize parameters of an ADFM based on the data obtained through the battery charge and discharge cycle experiment, the OCV-SOC LUT, or the like (S220).

In this case, an ADF may be a model designed such that when the number of charge and discharge cycles and charge and discharge cycle conditions are input to the ADF, the ADF may output a relative capacity variation value of the battery at the number of charge and discharge cycles. For example, it may be assumed that the ADF is an n-th order polynomial. When the ADF is set to be a third order polynomial, the ADF may be expressed by Equation 1 below.

$$ADF(x) = \Sigma_{m=1,\ (i,j,k) \in CR(3,3)}^{3H3} \alpha_{3,m} x_i x_j x_k + \Sigma_{m=1,\ (i,j) \in CR(3,2)}^{3H2} \alpha_{2,m} x_i x_j + \Sigma_{m=1,\ (i,j) \in CR(3,1)}^{3H1} \alpha_{1,m} x_i + \alpha_0 \quad \text{[Equation 1]}$$

In this case, CR(m,n) may be a set of combinations of n natural numbers selected with repetition from natural numbers (1, 2, 3, ..., and m), e.g., may be a set of combinations with repetition. The number of elements of the set CR(m,n) may be $_m H_n = _{m+n-1}C_n$. For example, CR (3,3)={(1,1,2), (2,2,2), (1,3,3), (1,1,1), ...}, e.g., CR(3,3) may be a set having $_3H_3$=10 elements.

In an implementation, the ADF may include, as factors, current C-rate, SOC, and temperature (T), and the value of the ADF may be an aging density. In this case, the aging density may refer to the amount of variation in relative capacity per unit time.

To implement the ADFM, the prediction system 10 may acquire a relative capacity variation amount by integrating the relative capacity variation amount per unit time obtained using the ADF with respect to time. This may be expressed by Equation 2 below.

$$\text{Relative Capacity Variation Amount} = -\Delta\left(\frac{Cap}{Cap_{refresh}}\right) = \frac{Cap(t_1) - Cap(t_2)}{Cap_{fresh}} = \int_{t_1}^{t_2} ADF(C-rate, SOC, T) dt \quad \text{[Equation 2]}$$

Equation 2 expresses a relative capacity variation amount (relative capacity loss) from a time $t_1$ to a time $t_2$. Here, $Cap_{fresh}$ refers to the capacity value of a secondary battery that has not undergone any charge and discharge cycle.

In addition, when the relative capacity loss amount immediately after the nth cycle is referred to as C(n), Equation 3 for calculating a first relative capacity loss amount may be multiplied out by mapping the minimum SOC and the maximum SOC of each cycle using the OCV-SOC LUT according to the definition of the ADF. The first relative capacity loss amount may be a relative capacity loss amount calculated by an equation using the definition of ADF.

$$C(n, \theta, Q) = -\frac{B}{A}(1 - (A+1)^n) \quad \text{[Equation 3]}$$

In Equation 3, A and B may be a function of parameters $\theta = (\alpha_0, \alpha_{1,1} \sim _2H_1,\ \alpha_{2,1} \sim _3H_2,\ \alpha_{3,1} \sim _3H_3)$ of the ADF and a function of charge and discharge cycle conditions Q=(C-rate 1, C-rate 2, Cut-off voltage 1, Cut-off voltage 2, Rest time).

In Equation 3, the cut-off voltages are assumed to be the maximum SOC and the minimum SOC, and the capacity value in one cycle is assumed to be a constant in the cycle.

In an implementation, the prediction system 10 may obtain a second relative capacity loss amount in an actual charge and discharge cycle of the battery based on the obtained experimental data. The second relative capacity loss amount may be a relative capacity loss amount calculated using information obtained through actual experimental data.

The second relative capacity loss amount of the battery may be calculated using Equation 4.

$$\text{Relative Capacity Loss Amount} = C = 1 - \frac{Cap}{Cap_{fresh}}. \quad \text{[Equation 4]}$$

In this case, $C_k(n)$ may be a relative capacity loss value at an n-th cycle in k-th data. For example, assuming that the fresh capacity $Cap_{fresh}$ is 2,000 mAh and the capacity after 100 cycles is 1,900 mAh, the relative capacity loss value of the battery after 0 cycle in the first data is $$C_1(0) = 1 - \frac{2000}{2000} = 0,$$

and the relative capacity loss value of the battery after 100 cycles in the first data is $$C_1(100) = 1 - \frac{1900}{2000} = 0.05.$$

In an implementation, the prediction system 10 may optimize the parameters of the ADF based on the first relative capacity loss amount and the second relative capacity loss amount. For example, the prediction system 10 may obtain the sum of squared differences between capacity loss values by using the Levenberg-Marquardt algorithm (LMA).

$$\theta^* = \text{argmin}_\theta \Sigma_{i=1}^M \Sigma_{j=1}^{N_i} [C(n_j, \theta, Q_i) - C_i(n_j)]^2 \quad \text{[Equation 5]}$$

In Equation 5, M refers to the number of pieces of data, and $N_i$ refers to the number of times the capacity of the battery is measured in the i-th piece of data. $n_j$ refers to the number of charge and discharge cycles when the capacity of the battery is measured j times.

In an implementation, the prediction system 10 may obtain θ* that minimizes the sum of squared capacity loss errors by using the LMA as shown in Equation 5. The prediction system 10 may update the ADF based on θ*, e.g., optimized parameters.

The prediction system 10 may generate virtual data by setting various cycle conditions using the ADFM of Equation 3 updated using the obtained θ* (S230), and may train an AI model by designating the virtual data and experimental data as training data (S240).

In an implementation, when the amount of the virtual data is excessively large, the influence of the experimental data on the AI model may be markedly reduced, and the prediction system 10 may perform a control such that the experimental data and the virtual data may be involved in training at equivalent proportions. For example, when there are ten thousand pieces of virtual data and ten pieces of experimental data, the difference is thousand-fold, and the prediction system 10 may perform training with the experimental data one thousand times for each training with the virtual data.

In an implementation, the prediction system 10 may use the trained AI model to obtain information about the progress of aging of the battery by considering C-rates such as a charge rate or a discharge rate, SOC sections, and temperature sections of the battery, and to obtain predicted values for variations in the relative capacity of the battery (S250).

In an implementation, values predicted for the capacity of the battery may be efficiently obtained with high reliability by using the AI model without users having to perform experiments to obtain results for particular conditions.

Figure 3:
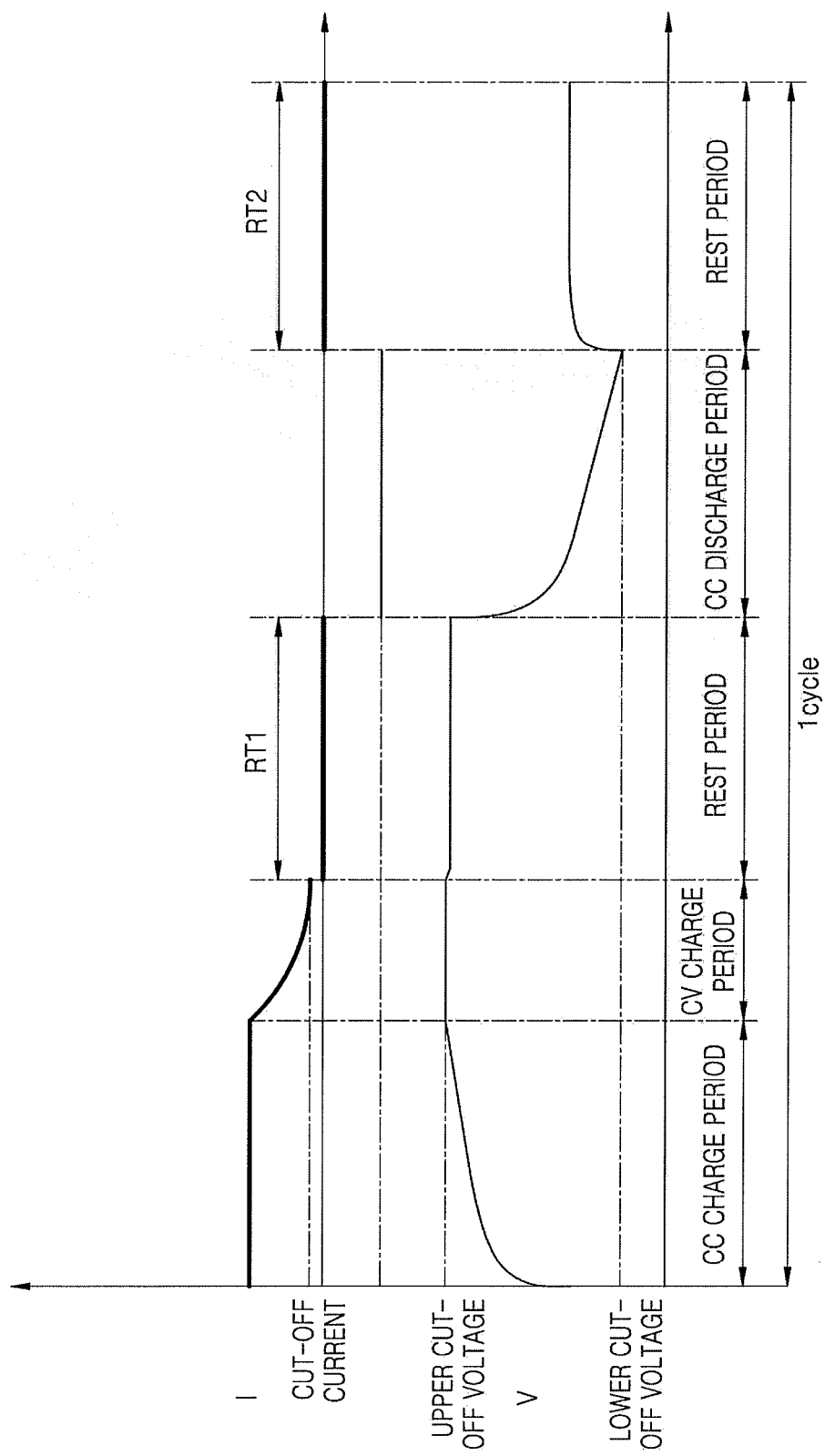
FIG. 3 illustrates a graph of a battery charge and discharge cycle for the prediction system for obtaining experimental data according to an embodiment.

FIG. 3 illustrates a graph of a battery charge and discharge cycle for the prediction system 10 to obtain experimental data according to an embodiment.

The prediction system 10 may obtain, as experimental data, results generated by repeatedly performing a cycle experiment based on a predefined cycle. For example, experimental data on the battery may be obtained by repeating a charge and discharge cycle experiment.

In an implementation, the predefined cycle may include a CC charge period, a CV charge period, a first rest period, a CC discharge period, and a second rest period. A process that proceeds in this order is defined as one charge and discharge cycle.

The CC charge period may be a period for charging with a CC; the CV charge period may be a period for charging at a CV after reaching an upper cut-off voltage; the first rest period may be a period during which no current is applied after reaching a cut-off current; the CC discharge period may be a period for discharging with a CC; and the second rest period may be a period during which no current is applied after reaching a lower cut-off voltage. In an implementation, the first rest period and the second rest period may have the same length.

Figure 4:
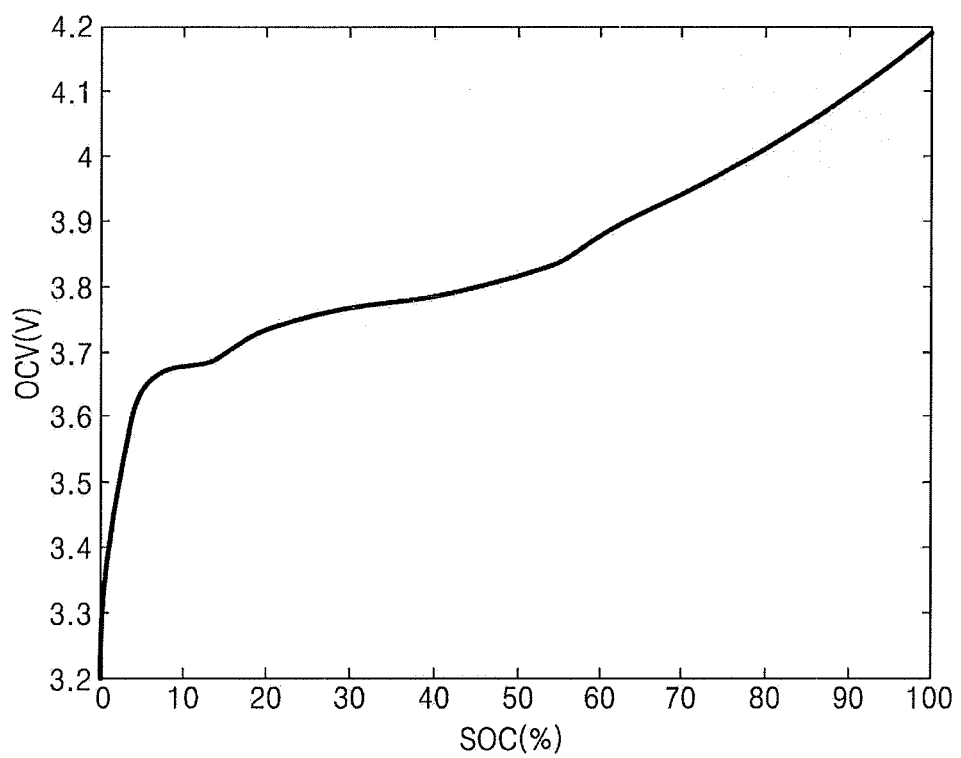
FIG. 4 illustrates a graph of a reference performance test (RPT) on a battery according to an embodiment.

FIG. 4 illustrates a graph of an RPT according to an embodiment.

In an implementation, the prediction system 10 may obtain data by performing an RPT every preset number of charge and discharge cycles. As noted above, the RPT may refer to an experiment in which charging is continuously performed with a CC of 0.01 C-rate or less from a $V_{min}$ at which the SOC of a battery is defined as 0% to a $V_{max}$ at which the SOC of the battery is defined as 100%. The RPT may be performed in order to measure the varying capacity of the battery.

In an implementation, the prediction system 10 may acquire a capacity value (mAh) by integrating current value data with respect to time during the RPT. In an implementation, an OCV-SOC LUT may be obtained based on data obtained through a continuous discharge experiment performed at a CC of 0.01 C-rate or less.

In the graph (OCV-SOC graph), the horizontal axis may refer to the SOC of the battery, and the vertical axis may refer to the OCV of the battery (terminal voltage in an open state: e.g., voltage when no current is applied). The use of such an OCV-SOC graph as shown in FIG. 4 makes it possible to approximately estimate the SOC of the battery by measuring the OCV of the battery.

Figure 5A:
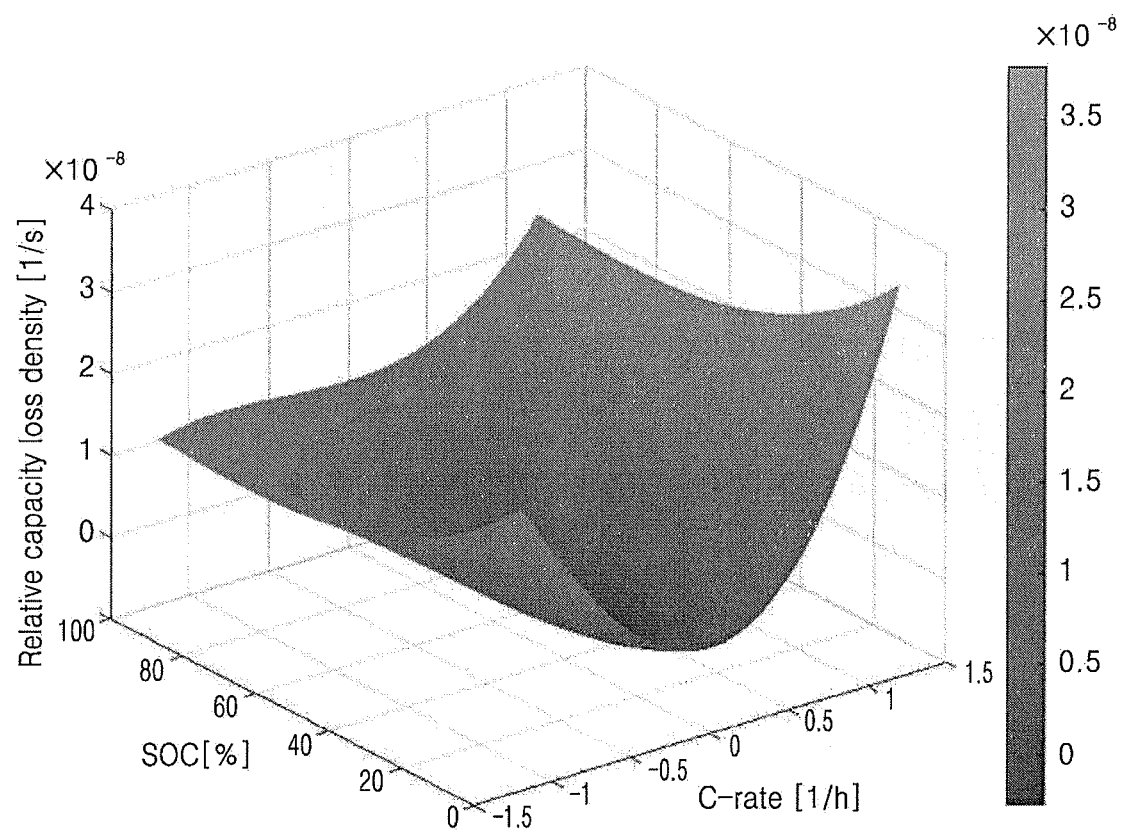
FIGS. 5A and 5B illustrate graphs of relative capacity loss variations per unit time of a battery.
Figure 5B:
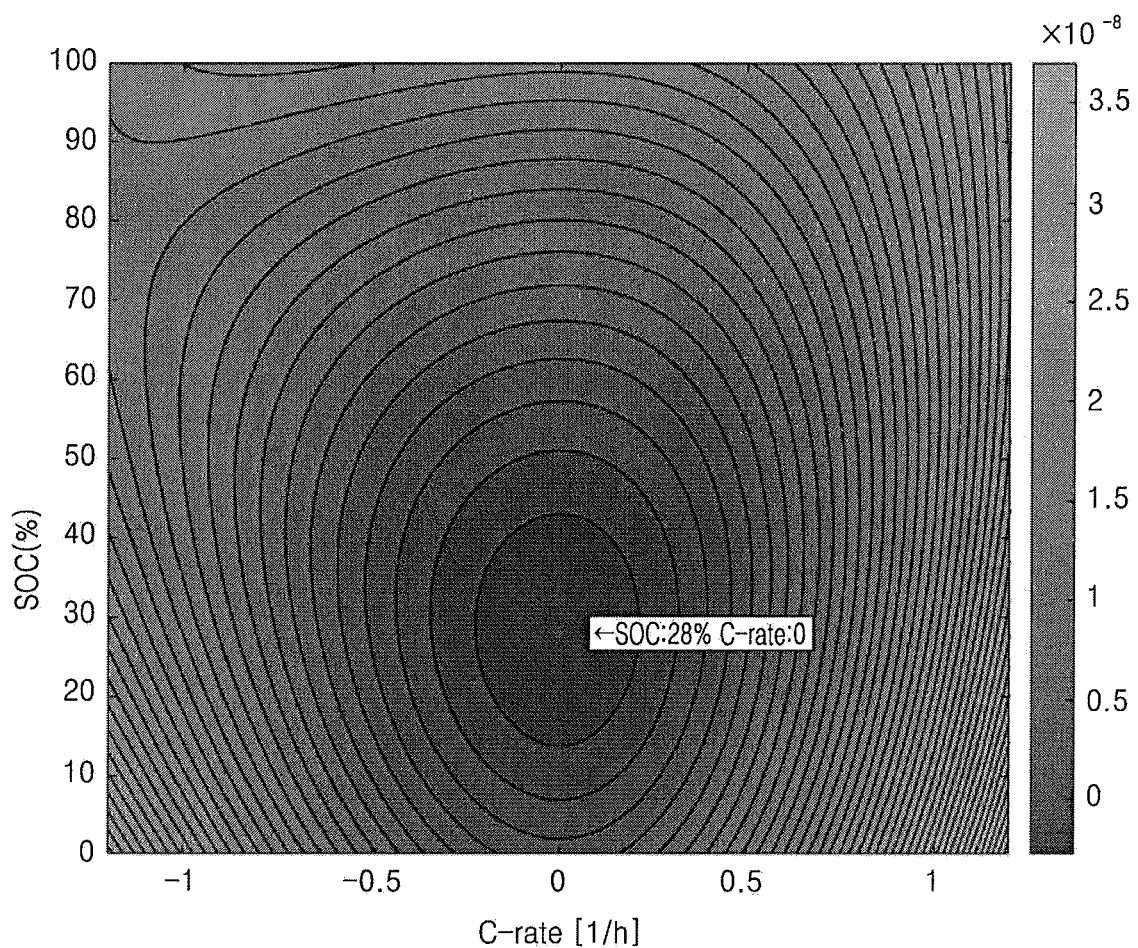

FIGS. 5A and 5B illustrate graphs of relative capacity loss variations per unit time.

FIGS. 5A and 5B are views illustrating relative capacity loss per unit time, e.g., aging density prediction values, with respect to C-rate conditions.

Referring to the three-dimensional graph of FIG. 5A, the X-axis represents C-rate (1/h), the Y-axis represents SOC (%), and the Z-axis represents relative capacity variations per unit time, e.g., aging density (1/s). For example, a prediction value for aging density may be obtained for each SOC corresponding to the present charge and discharge C-rate of a battery by using FIG. 5A.

FIG. 5B shows the graph of FIG. 5A in two dimensions. In FIG. 5B, the X-axis represents C-rate (1/h), and the Y-axis represents SOC (%). Each coordinate point (X value, Y value) is marked with a corresponding relative capacity variation per unit time, e.g., aging density value (1/s), by using a contour line and a different shade of gray.

Referring to FIG. 5B, it may be seen that when the C-rate value is 0 and the SOC value is 28%, the aging density of the battery is minimal.

For example, using FIG. 5A and FIG. 5B, information on a C-rate condition in which the aging density of the battery is minimal may be obtained, thereby facilitating optimal battery usage modeling.

In addition, information on aging prediction values may be obtained according to current conditions, SOC sections, and temperature sections through optimal ADF tuning by using cycle charge and discharge data. The lifespan of the battery may be increased by operating the battery using the information.

By way of summation and review, models for predicting the SOH of batteries may be necessary. In addition to estimating the present SOH, models for predicting a SOH value when a particular battery usage pattern continues may be needed.

SOH predicting methods may be classified into three categories: a physical model method, an empirical model method, and a data-driven model method.

The physical model method is a method of using a model for predicting how aging progresses according to usage patterns by modeling electrochemical phenomena inside a battery into several partial differential equations. Most models using this method are general-purpose models for predicting how much aging occurs when arbitrary inputs are applied to batteries. This method requires accurate knowledge of numerous parameter values inside batteries for the accuracy of prediction. It is possible to obtain some parameter values during battery production, but not all parameters. In addition, modeled phenomena may not reflect the full complexity inside batteries, and thus there is no standardized physical model for accurately modeling battery aging. In addition, physical models may require a long calculation time because complex partial differential equations have to be solved.

The empirical model method is generally for modeling aging with respect to charge and discharge cycles having a constant pattern. The empirical principles may be used: the first is that capacity variations follow a power law with respect to the number of cycles; the second is that capacity variations are expressed as a function of the current throughput of a battery; and the third is that the influence of temperature on capacity variations follows the Arrhenius law. Most empirical models are simple mathematical models based on the above-mentioned principles, and may not require a high-performance computer owing to a small amount of calculation. Even in the case of empirical models, countless models may be possible according to combinations of the principles, and there is no standardized empirical model that has been proven to be accurate. In addition, with the above-mentioned principles, it may be difficult to express all the physical principles of secondary batteries having various types and characteristics, and empirical modes may result in large errors when used for specific types of batteries.

The data-driven model method is a method of predicting capacity variations by training a machine learning model using data obtained through battery experiments. This method makes it possible to reflect all the various physical characteristics of batteries and to create a prediction model capable of predicting capacity variations with respect to arbitrary inputs. A drawback of data-driven models is that it may be difficult to perform accurate prediction when data is insufficient. It may not be easy to obtain a large amount of data about batteries. This is due to the high costs and long time required for performing battery experiments. The data-driven model method may not be a practical method.

One or more embodiments may provide an artificial intelligence (AI) system configured to imitate the functions of the human brain such as perception or determination by using a machine learning algorithm, and applications of the AI system.

One or more embodiments may provide a method of predicting variations in the capacity of a secondary battery according to charge and discharge cycles by using a model, which is prepared using a relatively small amount of data but reflects physical characteristics of various batteries with a small amount of calculation.

One or more embodiments may provide a reliable and accurate method and system for predicting variations in the capacity of a secondary battery according to charge and discharge cycles.

Unlike methods based on other physical models, an algorithm according to an embodiment may be multiplied out into a simple equation without differential equations and may require a relatively short calculation time.

Furthermore, according to an embodiment, unlike the empirical model method, the common empirical principle that all types of batteries have different aging rates according to current, state of charge (SOC), and temperature may be applied, and an aging density function (ADF) relating to the rate of aging may be provided in the form of a polynomial which is tunable using parameters, thereby making it possible to model various types of batteries.

Furthermore, according to an embodiment, prediction may be possible using data which has much fewer parameters to be optimized than parameters to be optimized in the data-driven model method and physical model method, and thus the time and costs necessary for prediction may be reduced.

In addition, according to an embodiment, an AI model may be finally used such that prediction values and reliability thereof may be improved.

In addition, according to an embodiment, information about the progress of aging of a battery may be obtained by considering C-rates such as a charge rate or a discharge rate, SOC sections, and temperature sections of the battery, and the lifespan of the battery may be increased by operating the battery using the information.

In addition, according to an embodiment, results corresponding to given conditions may be predicted using existing data without a user having to perform an experiment, and thus battery evaluation test costs may be reduced.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery capacity prediction system, comprising:
    an aging density function model (ADFM) management device;
    and a server,
    wherein the ADFM management device includes:
        an experimental data collector configured to collect at least one first piece of data about the capacity of the battery according to a number of charge and discharge cycles and charge and discharge cycle conditions of the battery,
        an ADF optimizer configured to optimize a first calculation equation for predicting a relative capacity variation value of the battery based on the at least one first piece of data, wherein the first calculation equation calculates the relative capacity variation value by integrating an aging density of the battery with respect to time based on the at least one first piece of data, and
        a virtual data generator configured to generate at least one second piece of data about the relative capacity variation value corresponding to the number of charge and discharge cycles and the charge and discharge conditions of the battery, based on the first calculation equation;
    wherein the server includes:
        a training unit configured to train an artificial intelligence model for outputting the relative capacity variation value by using the at least one first piece of data and the at least one second piece of data as training data, and
        a prediction unit configured to obtain a relative capacity variation prediction value, which is output from the artificial intelligence model when the number of charge and discharge cycles and the charge and discharge conditions of the battery are input to the artificial intelligence model,
    collecting the at least one first piece of data includes:
        performing a reference performance test (RPT) on the battery every preset number of charge and discharge cycles; and
        obtaining an open circuit voltage-state of charge lookup table (OCV-SOC LUT) based on results of the RPT,
    the first calculation equation is also for calculating the relative capacity variation value by calculating combinations with repetition based on a charge rate, a discharge rate, a maximum state of charge (SOC) per cycle, a minimum SOC per cycle, and a temperature of the battery, and
    the optimizing of the first calculation equation includes determining the maximum SOC per cycle and the minimum SOC per cycle of the battery based on the OCV-SOC LUT.

2. A computer-implemented method of predicting variations in a capacity of a battery according to charge and discharge cycles of the battery, the method comprising:
    collecting at least one first piece of data about the capacity of the battery according to a number of charge and discharge cycles and charge and discharge cycle conditions of the battery;

optimizing a first calculation equation for predicting a relative capacity variation value of the battery based on the at least one first piece of data, wherein the first calculation equation calculates the relative capacity variation value by integrating an aging density of the battery with respect to time based on the at least one first piece of data;

generating at least one second piece of data about the relative capacity variation value corresponding to the number of charge and discharge cycles and the charge and discharge conditions of the battery, based on the first calculation equation;

training an artificial intelligence model for outputting the relative capacity variation value by using the at least one first piece of data and the at least one second piece of data as training data; and obtaining a relative capacity variation prediction value, which is output from the artificial intelligence model when the number of charge and discharge cycles and the charge and discharge conditions of the battery are input to the artificial intelligence model, wherein:

collecting the at least one first piece of data includes:
performing a reference performance test (RPT) on the battery every preset number of charge and discharge cycles; and
obtaining an open circuit voltage-state of charge lookup table (OCV-SOC LUT) based on results of the RPT, the first calculation equation is for calculating the relative capacity variation value by calculating combinations with repetition based on a charge rate, a discharge rate, a maximum state of charge (SOC) per cycle, a minimum SOC per cycle, and a temperature of the battery, and the optimizing of the first calculation equation includes determining the maximum SOC per cycle and the minimum SOC per cycle of the battery based on the OCV-SOC LUT.

3. The computer-implemented method as claimed in claim 2, wherein:

the charge and discharge conditions of the battery include a constant current charge period, a constant voltage charge period, a first rest period, a constant current discharge period, and a second rest period, and collecting the at least one first piece of data further includes collecting information about the capacity of the battery according to the charge and discharge conditions.

4. The computer-implemented method as claimed in claim 2, wherein optimizing the first calculation equation further includes:

obtaining a parameter of the first calculation equation, the parameter minimizing an error between a first relative capacity loss amount obtained based on the first calculation equation and a second relative capacity loss amount obtained based on the at least one first piece of data; and updating the first calculation equation based on the parameter.

* * * * *